(12) United States Patent
Madpur et al.

(10) Patent No.: US 10,528,286 B2
(45) Date of Patent: Jan. 7, 2020

(54) INTERFACE FOR NON-VOLATILE MEMORY

(71) Applicant: SanDisk Technologies LLC, Plano, TX (US)

(72) Inventors: Ravindra Arjun Madpur, Bangalore (IN); Amandeep Kaur, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/671,128

(22) Filed: Aug. 7, 2017

(65) Prior Publication Data

US 2018/0136878 A1    May 17, 2018

Related U.S. Application Data

(63) Continuation-in-part of application No. 15/365,944, filed on Nov. 30, 2016.

(30) Foreign Application Priority Data

Nov. 11, 2016  (IN) .............................. 201641038622

(51) Int. Cl.
*G06F 3/06*         (2006.01)
*G06F 13/16*        (2006.01)
(Continued)

(52) U.S. Cl.
CPC .......... *G06F 3/0659* (2013.01); *G06F 3/0625* (2013.01); *G06F 3/0688* (2013.01);
(Continued)

(58) Field of Classification Search
CPC .... G06F 3/0659; G06F 3/0613; G06F 3/0679; G11C 16/08
See application file for complete search history.

(56) References Cited

U.S. PATENT DOCUMENTS 5,022,004 A    6/1991  Kurtze et al.
5,548,795 A    8/1996  Au
(Continued)

OTHER PUBLICATIONS

JEDEC Standard, Low Power Double Data Rate 3 (LPDDR3), JESD209-3, May 2012, Arlington, VA.
(Continued)

*Primary Examiner* — Getente A Yimer
(74) *Attorney, Agent, or Firm* — Vierra Magen Marcus LLP

(57) ABSTRACT

Apparatuses, systems, methods, and computer program products are disclosed for accessing non-volatile memory. An apparatus includes one or more memory die. A memory die includes an array of non-volatile memory cells, a set of ports, and an on-die controller. A set of ports includes a first port and a second port. A first port includes a first plurality of electrical contacts and a second port includes a second plurality of electrical contacts. An on-die controller communicates via a set of ports to receive command and address information and to transfer data for data operations on an array of non-volatile memory cells. An on-die controller uses a first port to receive command and address information and to transfer data. An on-die controller uses a second port to transfer data but not to receive command and address information.

18 Claims, 10 Drawing Sheets

(51) Int. Cl.
  *G06F 9/38* (2018.01)
  *G06F 13/42* (2006.01)
  *G11C 7/10* (2006.01)
(52) U.S. Cl.
  CPC ........ *G06F 9/3871* (2013.01); *G06F 13/1615* (2013.01); *G06F 13/4239* (2013.01); *G11C 7/1039* (2013.01)

(56) References Cited

U.S. PATENT DOCUMENTS

| | | | |
|---|---|---|---|
| 5,664,114 | A | 9/1997 | Krech, Jr. et al. |
| 5,951,635 | A | 9/1999 | Kamgar |
| 6,091,663 | A | 7/2000 | Kim et al. |
| 6,166,564 | A | 12/2000 | Rosen |
| 6,216,178 | B1 | 4/2001 | Stracovsky et al. |
| 6,263,410 | B1 | 7/2001 | Kao et al. |
| 6,385,129 | B1 | 5/2002 | Silvestri |
| 6,393,512 | B1 | 5/2002 | Chen et al. |
| 6,393,534 | B1 | 5/2002 | Chen et al. |
| 6,504,768 | B1 | 1/2003 | Roohparvar et al. |
| 6,567,321 | B2 | 5/2003 | Lee |
| 6,614,798 | B1 | 9/2003 | Bishop et al. |
| 6,628,563 | B1 | 9/2003 | Hsu et al. |
| 6,769,050 | B1 | 7/2004 | Ware et al. |
| 6,778,445 | B2 | 8/2004 | Ooishi et al. |
| 6,912,598 | B1 * | 6/2005 | Bedarida ................ G11C 16/10 365/189.04 |
| 7,038,952 | B1 | 5/2006 | Zack et al. |
| 7,038,953 | B2 | 5/2006 | Aoki |
| 7,184,508 | B2 | 2/2007 | Emberling |
| 7,254,688 | B2 | 8/2007 | Uneme |
| 7,277,982 | B2 | 10/2007 | Calvignac et al. |
| 7,310,396 | B1 | 12/2007 | Sabih |
| 7,499,364 | B2 | 3/2009 | Ahn et al. |
| 7,562,193 | B2 | 7/2009 | Floman et al. |
| 7,831,801 | B1 | 11/2010 | Anderson |
| 7,889,580 | B2 | 2/2011 | Millar et al. |
| 7,970,977 | B1 | 6/2011 | Li et al. |
| 8,019,950 | B1 | 9/2011 | Warshofsky et al. |
| 8,041,885 | B2 | 10/2011 | Jo et al. |
| 8,327,057 | B1 | 12/2012 | Venkatramani |
| 8,612,651 | B2 | 12/2013 | Boonstra et al. |
| 8,656,093 | B1 | 2/2014 | Edmondson et al. |
| 8,832,324 | B1 | 9/2014 | Hodges et al. |
| 8,914,589 | B2 | 12/2014 | Gregorius et al. |
| 8,924,680 | B2 * | 12/2014 | Perego ................ G06F 13/1678 711/170 |
| 9,087,568 | B1 | 7/2015 | Ware |
| 9,285,824 | B2 | 3/2016 | Zhu et al. |
| 9,851,905 | B1 | 12/2017 | Ramalingam et al. |
| 9,858,976 | B2 | 1/2018 | Ikegami et al. |
| 10,114,586 | B1 | 10/2018 | Benisty et al. |
| 10,254,967 | B2 | 4/2019 | Ouyang et al. |
| 2001/0036105 | A1 | 11/2001 | Takata |
| 2002/0159294 | A1 | 10/2002 | Kato |
| 2003/0120861 | A1 | 6/2003 | Calle et al. |
| 2004/0027856 | A1 | 2/2004 | Lee et al. |
| 2004/0027857 | A1 | 2/2004 | Ooishi |
| 2004/0057282 | A1 | 3/2004 | Cernea |
| 2004/0057283 | A1 | 3/2004 | Cernea |
| 2004/0060031 | A1 | 3/2004 | Cernea |
| 2004/0156235 | A1 | 8/2004 | Bellini et al. |
| 2005/0071547 | A1 | 3/2005 | Lin |
| 2005/0114556 | A1 * | 5/2005 | Solomon ................ G06F 13/423 710/5 |
| 2005/0273543 | A1 | 12/2005 | Middleton et al. |
| 2006/0140007 | A1 | 6/2006 | Cernea et al. |
| 2008/0005424 | A1 * | 1/2008 | Raines ................ H01R 27/00 710/62 |
| 2008/0094871 | A1 | 4/2008 | Parkinson |
| 2008/0109627 | A1 | 5/2008 | Toyama et al. |
| 2008/0151648 | A1 | 6/2008 | Eilert et al. |
| 2008/0225625 | A1 | 9/2008 | Parkinson et al. |
| 2009/0157985 | A1 | 6/2009 | Stevens et al. |
| 2009/0240873 | A1 | 9/2009 | Yu et al. |
| 2010/0100668 | A1 | 4/2010 | Huang |
| 2010/0100669 | A1 | 4/2010 | Huang |
| 2010/0103723 | A1 | 4/2010 | Kawai et al. |
| 2010/0185703 | A1 | 7/2010 | Yionen |
| 2011/0041039 | A1 * | 2/2011 | Harari ................ G06F 11/1068 714/773 |
| 2011/0051518 | A1 | 3/2011 | Fujimura |
| 2011/0051519 | A1 | 3/2011 | Lee et al. |
| 2011/0060875 | A1 * | 3/2011 | Haukness ................ G11C 16/10 711/103 |
| 2011/0069526 | A1 | 3/2011 | Schuette |
| 2011/0072200 | A1 | 3/2011 | Lee et al. |
| 2011/0072201 | A1 | 3/2011 | Lee et al. |
| 2011/0119425 | A1 | 5/2011 | Kollipara et al. |
| 2011/0208905 | A1 | 8/2011 | Shaeffer et al. |
| 2012/0033496 | A1 | 2/2012 | Yano et al. |
| 2012/0066439 | A1 | 3/2012 | Fillingim et al. |
| 2012/0210041 | A1 | 8/2012 | Flynn et al. |
| 2012/0213012 | A1 | 8/2012 | Johnson et al. |
| 2012/0250411 | A1 | 10/2012 | Abiko et al. |
| 2012/0260032 | A1 | 10/2012 | Chiu et al. |
| 2013/0054885 | A1 * | 2/2013 | Choi ................ G11C 8/16 711/105 |
| 2013/0188482 | A1 | 7/2013 | Lee |
| 2013/0232296 | A1 | 9/2013 | Yonezawa et al. |
| 2013/0246716 | A1 | 9/2013 | Kato et al. |
| 2014/0019672 | A1 | 1/2014 | Harasawa et al. |
| 2014/0075233 | A1 | 3/2014 | Baiting et al. |
| 2014/0250260 | A1 | 9/2014 | Yap |
| 2015/0186075 | A1 * | 7/2015 | Roberts ................ G06F 3/0659 710/74 |
| 2016/0092223 | A1 | 3/2016 | Wang et al. |
| 2016/0124639 | A1 | 5/2016 | Hyun et al. |
| 2017/0199668 | A1 | 7/2017 | Ouyang et al. |
| 2017/0262192 | A1 | 9/2017 | Aga et al. |
| 2018/0024948 | A1 | 1/2018 | Tsai et al. |
| 2018/0067648 | A1 | 3/2018 | Lin et al. |
| 2018/0136843 | A1 | 5/2018 | Lee et al. |
| 2018/0136851 | A1 | 5/2018 | Batra et al. |
| 2018/0136877 | A1 | 5/2018 | Ouyang et al. |
| 2018/0260347 | A1 | 9/2018 | Benisty |

OTHER PUBLICATIONS

PCT International Patent Application No. PCT/US2017/049744 International Search Report and Written Opinion dated Dec. 13, 2017.
U.S. Appl. No. 15/408,318 Non-Final Rejection dated Feb. 15, 2018.
U.S. Appl. No. 15/408,318 Notice of Allowance dated Jul. 11, 2018.
U.S. Appl. No. 15/402,180 Notice of Allowance dated Nov. 23, 2018.
U.S. Appl. No. 15/365,944 Non-Final Rejection dated Dec. 6, 2018.
Office Action dated Jun. 11, 2019 in U.S. Appl. No. 15/365,944.

* cited by examiner

INTERFACE FOR NON-VOLATILE MEMORY

CROSS-REFERENCES TO RELATED APPLICATIONS

This patent application is a continuation-in-part application of and claims priority to U.S. patent application Ser. No. 15/365,944 entitled "INTERFACE FOR NON-VOLATILE MEMORY" and filed on Nov. 30, 2016 for Jiwang Lee et al., which claims priority to India Patent Application No. 201641038622 filed on Nov. 11, 2016 for Jiwang Lee et al., the entire contents of each of which are incorporated herein by reference for all purposes.

TECHNICAL FIELD

The present disclosure, in various embodiments, relates to non-volatile memory and more particularly relates to interfaces for accessing non-volatile memory.

BACKGROUND

As non-volatile memory technologies emerge, with higher speeds than previous non-volatile technologies, the interfaces and protocols associated with the previous non-volatile technologies may not be suited for the higher speed non-volatile memory technologies. Similarly, while volatile memory interfaces and protocols may be used for high speed data transfers using volatile memory, volatile memory interfaces and protocols may not be suited for the different latencies or the persistence of non-volatile memory technologies.

SUMMARY

Apparatuses are presented for accessing non-volatile memory. In one embodiment, an apparatus includes one or more memory die. In a certain embodiment, a memory die includes an array of non-volatile memory cells. In a further embodiment, a memory die includes a set of ports. In one embodiment, a set of ports includes a first port and a second port. In a certain embodiment, a first port includes a first plurality of electrical contacts and a second port includes a second plurality of electrical contacts. In one embodiment, a memory die includes an on-die controller that communicates via a set of ports to receive command and address information and to transfer data for data operations on an array of non-volatile memory cells. In a certain embodiment, an on-die controller uses a first port to receive command and address information and to transfer data. In a further embodiment, an on-die controller uses a second port to transfer data but not to receive command and address information.

Methods are presented for accessing non-volatile memory. A method, in one embodiment, includes receiving command and address information via a first port of a memory die, for read operations of the memory die. In a certain embodiment, a method includes transferring data of read operations from a core array of a memory die to a set of latches of the memory die. In a further embodiment, a method includes transferring data of read operations from latches to a device controller via a first port and a second port of a memory die. In certain embodiments, a second port is configured to transfer data but not to receive command and address information.

An apparatus, in another embodiment, includes means for receiving command and address information for data operations of a memory die. In a certain embodiment, an apparatus includes means for transferring data for data operations of a memory die. In a further embodiment, a means for transferring data comprises electrical contacts of a means for receiving command and address information, and additional electrical contacts.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
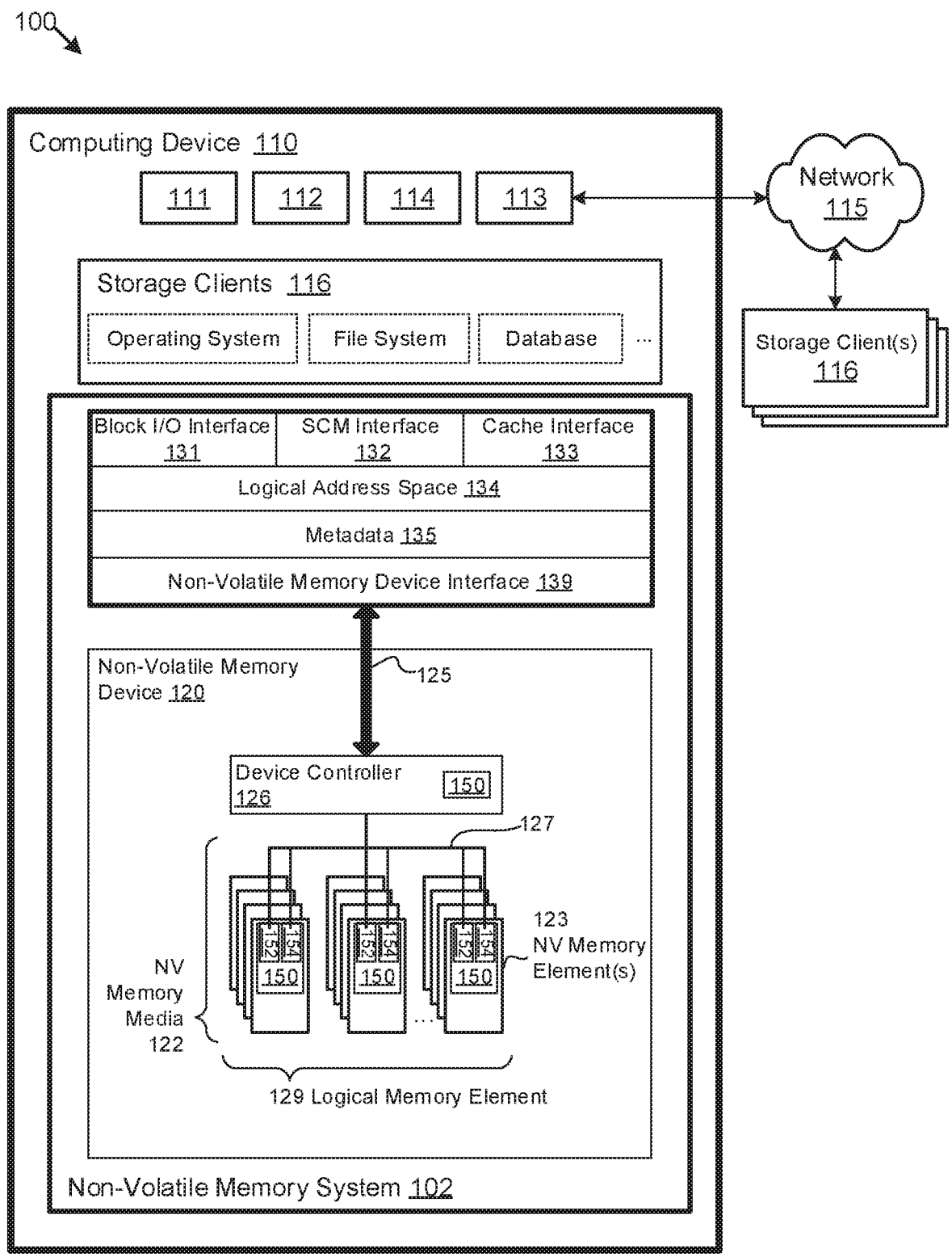
FIG. 1 is a schematic block diagram of one embodiment of a system comprising an interface component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, resistive (e.g., resistive random access memory (ReRAM), memory resistor (Memristor) memory, programmable metallization cell memory, phase-change memory (PCM, PCME, PRAM, PCRAM, ovonic unified memory, chalcogenide RAM, or C-RAM), or the like), or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising an interface component 150 for a non-volatile memory device 120. The interface component 150 may be part of and/or in communication with a device controller 126, a non-volatile memory element 123, a device driver, or the like. The interface component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor die, chips, packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, one or more portions of the interface component 150 may be embodied as one or more computer readable instructions stored on the non-transitory storage medium 114.

The non-volatile memory system 102, in the depicted embodiment, includes an interface component 150. The interface component 150, in one embodiment, is configured to transmit and receive data for data operations for the non-volatile memory device 120 and/or for one or more non-volatile memory elements 123. For example, the interface component 150 may comprise hardware of the device controller 126, hardware of one or more non-volatile memory elements 123, or the like. In one embodiment, the interface component 150 may comprise a first port 152 with a first plurality of electrical contacts for a non-volatile memory device 120 and/or element 123 and a second port 154 with a second plurality of electrical contacts for the non-volatile memory device 120 and/or element 123. The interface component 150 may support multiple access modes, such as a first mode (e.g., a burst mode) which may provide a full speed and/or access to one or more unique features of the non-volatile memory media 122, a second mode (e.g., a page mode, legacy mode or compatibility mode) which may provide support for a different access protocol (e.g., an older access protocol, emulating a different type of memory media 122 such as NAND flash, or the like). In certain embodiments, the interface component may use the first port 152 to receive command and address information and to transfer data for data operations, and may use the second port 154 to transfer data but not to receive command and address information (e.g., the second port 154 may be a data-only port).

In one embodiment, the non-volatile memory media 122 may comprise a resistive memory medium such as ReRAM, Memristor memory, programmable metallization cell memory, phase-change memory (PCM, PCME, PRAM, PCRAM, ovonic unified memory, chalcogenide RAM, or C-RAM), or the like. In a further embodiment the interface component 150 may provide two or more access modes, including as a legacy or compatibility mode which emulates a page-level NAND flash access protocol (e.g., a NAND flash toggle mode), or the like, for clients 116 configured to use a legacy access protocol.

In a first mode (e.g., a burst mode, a native mode, or the like) the first port 152 may receive command and/or address information for data operations on the non-volatile memory device 120 and/or element 123, while the second port 154 transmits data of the data operations (e.g., receiving data from a client 116 for a write request, sending data to a client 116 for a read request, or the like). In a second mode (e.g., a page mode, a legacy mode, a compatibility mode, or the like) the first port 152 may both receive command and address information for data operations and transmit data for the operations. In one embodiment, the second port 154 may be unused in a page mode. In another embodiment, the second port 154 may transmit data simultaneously with the first port 152 in a page mode. The interface component 150 may comprise a command queue that stores multiple commands to be executed on one or more non-volatile memory elements 123, even if the commands are in different modes.

In certain embodiments, the interface component 150 may latch and/or clock command and address information for commands for one or more non-volatile memory elements 123 (e.g., integrated circuit chips, packages, die, die planes, or other discrete units of non-volatile memory media 122) according to a first clock/strobe signal received on one or more command and address strobe lines. The interface component 150 may latch and/or clock data for commands for one or more non-volatile memory elements 123 according to a second clock signal received on one or more data strobe lines.

In this manner, in certain embodiments, the interface component 150 may operate with no free running clock between the device controller 126 and a non-volatile memory element 123, relying instead on one or more command and address strobe signals and/or one or more data strobe signals. As described in greater detail below, in one embodiment, a free running clock comprises an alternating timing signal transmitted (e.g., from a device controller 126 to a non-volatile memory element 123, or the like) with little or no interruption, throughout multiple commands, to provide timing for the multiple commands and/or other operations. In certain embodiments, a free running clock may be substantially constant and/or continuous while a device controller 126 is in a powered on state. The interface component 150, in one embodiment, may time the sensing of a command and address strobe and/or a data strobe based on a transition in a clock enable signal, avoiding the use of a free running clock. A strobe and/or strobe signal, as used herein, comprises a temporary timing signal transmitted (e.g., from a device controller 126 to a non-volatile memory element 123, or the like) for a single command and/or operation or less (e.g., for a portion of a command and/or operation).

In one embodiment, the interface component 150 may comprise logic hardware of one or more non-volatile memory devices 120, such as a device controller 126, a non-volatile memory element 123, a field-programmable gate array (FPGA) or other programmable logic, firmware for an FPGA or other programmable logic, microcode for execution on a microcontroller, an application-specific integrated circuit (ASIC), or the like. In another embodiment, the interface component 150 may comprise executable software code, such as a device driver or the like, stored on the computer readable storage medium 114 for execution on the processor 111. In a further embodiment, the interface component 150 may include a combination of both executable software code and logic hardware.

In one embodiment, the interface component 150 is configured to receive storage requests from a device driver or other executable application via a bus 125 or the like. The interface component 150 may be further configured to transfer data to/from a device driver and/or storage clients 116 via the bus 125. Accordingly, the interface component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the interface component 150 may receive storage requests as an API call from a storage client 116, as an IO-CTL command, or the like.

According to various embodiments, a device controller 126 in communication with one or more interface components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A device controller 126 may be configured to manage data operations on the non-volatile memory media 122, and may comprise one or more processors, programmable processors (e.g., FPGAs), ASICs, micro-controllers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the device controller 126 over a bus 125, as described above.

Figure 2:
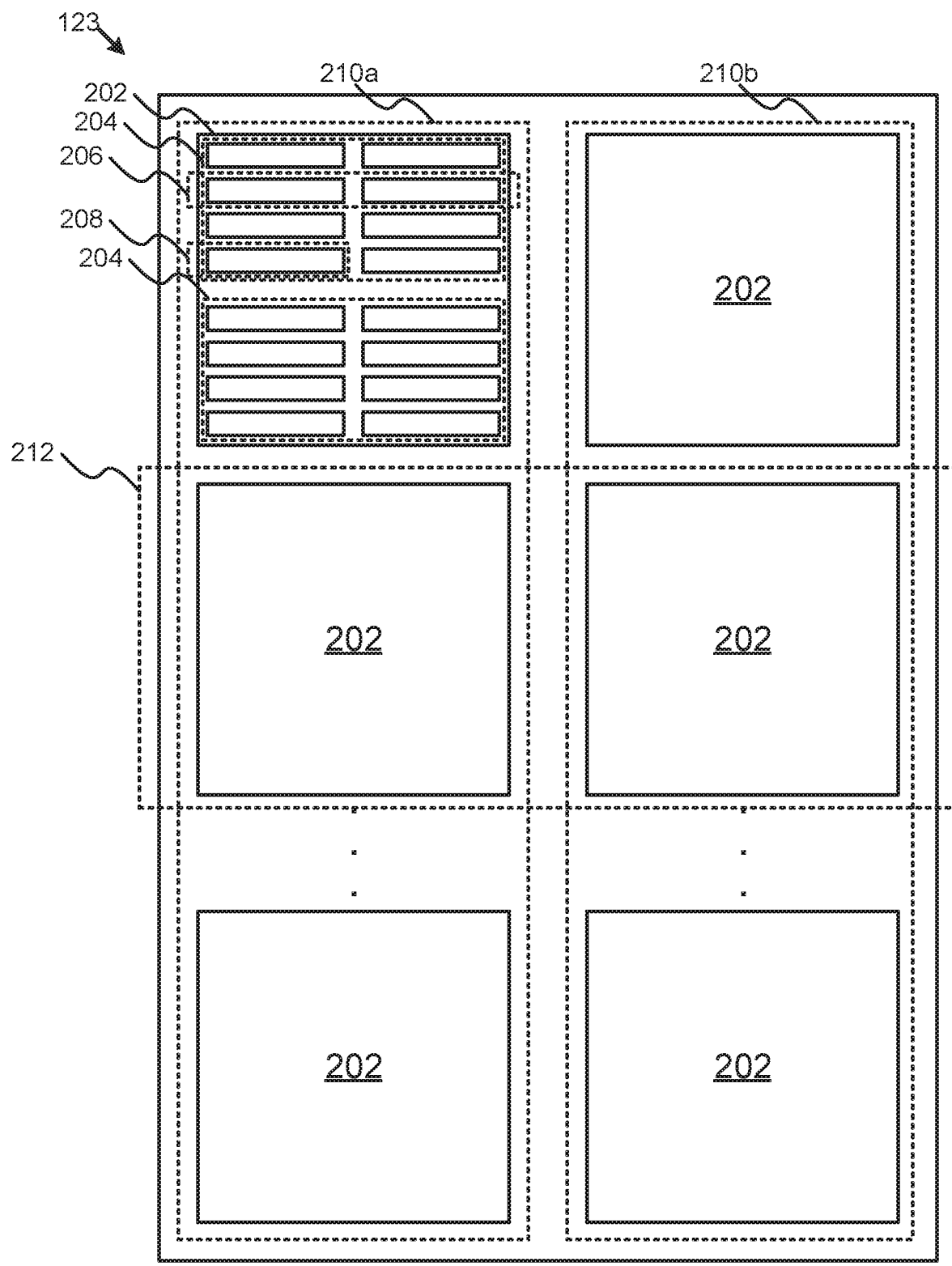
FIG. 2 is a schematic block diagram illustrating one embodiment of a non-volatile memory element.

FIG. 2 depicts one embodiment of a non-volatile memory element 123. In the depicted embodiment, the non-volatile memory element 123 comprises a package with multiple die 202 or cores 202 (e.g., 2 die, 4 die, 6 die, 8 die, 10 die, 12 die, 14 die, 16 die, 32 die, 64 die, or another number of die 202 or cores 202). Each die 202 or core 202 comprises a semiconductor device of non-volatile memory. A die 202 or core 202 may be divided into multiple bank groups 204 each with multiple banks 206 of non-volatile memory (e.g., 2 bank groups 204 of 4 banks 206 each, in the depicted embodiment). Each bank 206, in the depicted embodiment, comprises two sub-arrays 208 of non-volatile memory cells, which may be arranged into pages or the like. The die 202 or cores 202, in one embodiment, are divided into two or more channels 210a, b. Corresponding die 202 in the channels 210a, b may comprise a rank 212 of die 202. For example, in an embodiment where there are eight die 202 per channel 210a, b, there may be eight ranks, 0-7 per non-volatile memory element 123.

In one example embodiment, each sub-array 208 may comprise 32,768,000 8 Byte pages (e.g., for a 64 Gigabyte device) with 256 Megabytes per sub-array 208, may comprise 65,536,000 8 Byte pages (e.g., for a 128 Gigabyte device) with 512 Megabytes per sub-array 208, or the like. The two or more sub-arrays 208 per bank 206 may be independently addressable. A memory write, in one embodiment, is committed with a bank group 204 of four banks 206 and eight sub-arrays 208 per bank group 204 to support multiple concurrent independently addressable write transactions per die 202. For example, using write grouping on a memory die 202, one pending write transaction may be queued per sub-array 208 in an input register.

A write of queued data may be performed concurrently for sub-arrays 208 in a bank group 204, or the like. A read of data, in certain embodiments, may be performed independently for each bank 206 (e.g., 2 sub-arrays 208). In one embodiment, two read modes may be supported, such as a low latency read from a single sub-array 208 in a bank 206 and a high bandwidth group read from two sub-arrays 208 in a bank 206. For a group read, read grouping may be done in the device controller 126 that may send addresses of group reads consecutively and may receive read data consecutively. The die 202 may support write suspend by read.

The die 202, in one embodiment, support extended time for writes which have bit errors after initial write cycles complete. Writes requiring additional time, for example, may be captured on the die 202 on a write bank group 204 sub-array 208 basis. An extended write buffer flush command may indicate when data in one or more extended write buffers is to be rewritten to memory sub-arrays 208, or the like.

Figure 3:
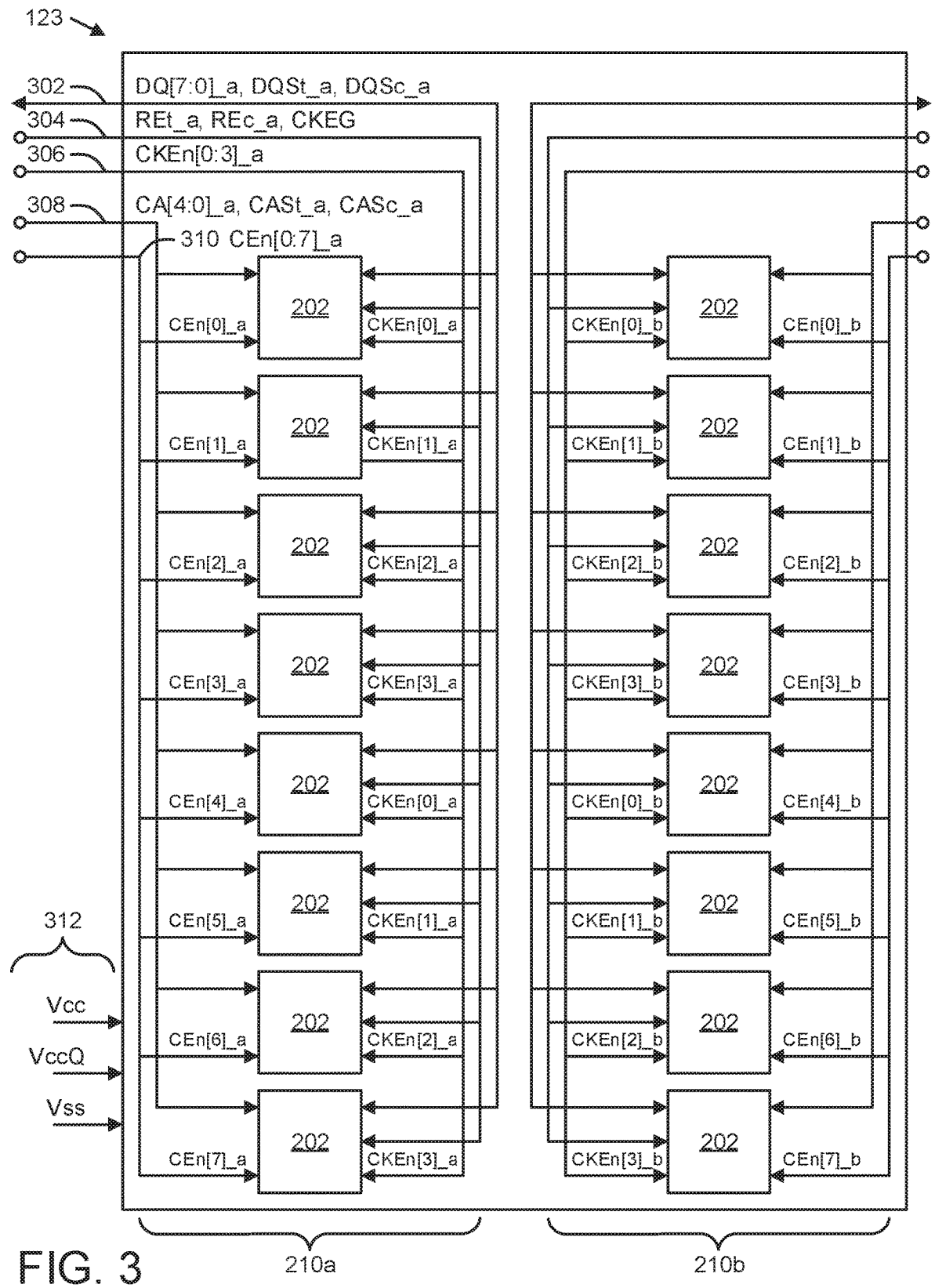
FIG. 3 is a schematic block diagram illustrating a further embodiment of a non-volatile memory element.

FIG. 3 depicts one embodiment of a non-volatile memory element 123. In the depicted embodiment, the non-volatile memory element 123 (e.g., a package or the like) comprises two channels 210a, b of multiple die 202 each. The die 202, in the depicted embodiment, are electrically connected to one or more data lines 302 (e.g., a data strobe line DQSt, a data strobe complement line DQSc, a bidirectional data bus DQ, or the like), one or more enable lines 304 (e.g., a read enable line REt, a read enable complement line REc, a rank group clock enable line CKEG, or the like), one or more clock enable lines 306 (e.g., a clock enable line CKEn, or the like), one or more command and address lines 308 (e.g., a command and address bus CA, a command and address strobe true line CASt, a command and address strobe complement line CASc, or the like), one or more chip enable lines 310 (e.g., a chip enable line CEn), or the like. For example, the non-volatile memory element 123 may comprise a plurality of electrical connections (e.g., pads, pins, solder balls, traces, ports, wires, or other conductors) in electrical communication with a device controller 126 to conduct electrical signals from the device controller 126 to the die 202 within the non-volatile memory element 123. In certain embodiments, to preserve electrical connections and/or for efficiency, the same electrical contacts or lines 302, 304, 306, 308, 310 may be used for different types of signals in different modes, different operations, and/or different states of the non-volatile memory element 123.

In one embodiment, a device controller 126 uses the chip enable line CEn 310 to select a target die 202 for a command and address bus CA 308. For example, when the chip enable signal CEn 310 is low, a target die 202 may be selected for receiving command and address information. When the chip enable signal CEn 310 goes high, in one embodiment, die 202 receivers can enter a reduced power state (e.g., subject to a predefined wakeup time or the like) and the associated read or write operation may continue in the die 202 core until completion, or the like. In the depicted embodiment, the chip enable line CEn 310 is an eight-bit line, so that the first bit of the chip enable line CEn 310 enables or disables a first die 202 for receiving command and address information, the second bit of the chip enable line CEn 310 enables or disables a second die 202 for receiving command and address information, and so on.

A device controller 126, in certain embodiments, uses the clock enable line CKEn 306 to select a target die 202 for the data bus DQ 302. For example, when the clock enable line CKEn 306 is low, the target die 202 may be selected for transferring data for a read or write operation. In one embodiment, when the clock enable line CKEn 306 goes high, the read enable RE signal 304 and/or the data strobe line DQS signal 302 cannot be recognized by the target die 202 and the read or write operation continues in the die 202 core until completion, or the like.

In embodiments with multiple ranks, the rank group clock enable line CKEG 304, when low, may cause the clock enable signals 306 to apply to a first set of die 202 ranks (e.g., ranks 0, 1, 2, and 3 or the like). When high, the rank group clock enable line CKEG 304 may cause the clock enable signals 306 to apply to a second set of die 202 ranks (e.g., ranks 4, 5, 6, and 7 or the like). For example, in the depicted embodiment, the clock enable line CKEn 306 is a four bit line so that the first bit of the clock enable line CKEn 306 enables or disables a die 202 of rank 0 or rank 4 for transferring data, the second bit of the clock enable line CKEn 306 enables or disables a die 202 of rank 1 or rank 5 for transferring data, and so on, and the rank group clock enable line CKEG 304 identifies whether the clock enable signals 306 apply to the lower-rank or higher-rank dies 202.

The one or more command and address strobe lines CAS 308, in certain embodiments, may comprise a command and address strobe true line CASt 308 and/or a command and address strobe complement line CASc 308. The command and address strobe line CAS 308 (e.g., a CASt line 308) may control latching of commands and/or addresses on the command and address bus CA 308, with, in one embodiment, command and/or address latching on rising and/or falling edge of strobes of the signal 308 (e.g., double data rate (DDR) signaling). A command and address strobe complement line CASc 308, in certain embodiments, is a complementary signal to the command and address strobe true line CASt 308, with the opposite value, to improve the robustness of the signaling on the physical channel, or the like.

The command and address bus CA 308, in one embodiment, transfers command and/or address information to a non-volatile memory element 123 and/or a die 202. The command and address bus CA 308 may comprise a multibit bus (e.g., 5 bit or the like). In one embodiment, the command and address bus CA 308 is a unidirectional bus.

In certain embodiments, the one or more read enable lines RE 304 enable serial data output from a targeted die 202. The one or more read enable lines RE 304, in one embodiment, comprise a read enable true line REt 304 and its complementary signal (e.g., with an opposite value), a read enable complement line REc 304, which may improve the robustness of the signaling on the physical channel, or the like.

In one embodiment, the one or more data strobe lines DQS 302 define and/or indicate a data value window for either outputting read data or inputting write data on the bidirectional data bus DQ 302. DDR signaling, or the like, in certain embodiments, may be used for data, with read data being edge-aligned, write data being centered, or the like. The one or more data strobe lines DQS 302, in one embodiment, comprises a data strobe true line DQSt 302 and its complementary signal, a data strobe complement line DQSc 302, with an opposite value, to improve the robustness of the signaling on the physical channel, or the like.

In certain embodiments, there is not a free running clock between the device controller 126 and the non-volatile memory element 123, but commands, addresses, and data are instead latched or strobed in, or out, using the strobe signals DQS 302 and CAS 308 described above. In one embodiment, a free running clock may comprise an alternating timing signal transmitted (e.g., from a device controller 126 to a non-volatile memory element 123, or the like) with little or no interruption, throughout multiple commands, to provide timing for the multiple commands and/or other operations. In certain embodiments, a free running clock may be substantially constant and/or continuous while a device controller 126 is in a powered on state. The non-volatile memory die 202, in one embodiment, may time the sensing of a command and address strobe and/or a data strobe based on a transition in a temporary clock enable signal, avoiding the use of a free running clock. A strobe and/or strobe signal, as used herein, comprises a temporary timing signal transmitted (e.g., from a device controller 126 to a non-volatile memory element 123, or the like) for a single command and/or operation or less (e.g., for a portion of a command and/or operation).

For example, in one embodiment, the non-volatile memory media 122 of the chips 202 may have a higher latency than volatile memory such as DRAM or the like. Running a clock constantly, while waiting for an operation to complete, may unnecessarily consume power, especially at high frequencies. Synchronizing operation of the non-volatile memory element 123 with an external clock, in certain embodiments, may also unnecessarily increase the complexity of the design.

In the depicted embodiment, the different channels 210a, 210b have substantially independent signals 302, 304, 306, 308, 310. In certain embodiments, one or more of the signals 302, 304, 306, 308, 310 may be tied together in common for the two channels 210a, 210b, such as a CKEG rank group clock enable 304, which enables die 202 of the same rank in both channels 210a, 210b. The non-volatile memory element 123, in the depicted embodiment, also includes a plurality of power and/or ground inputs 312, which the non-volatile memory element 123 may internally distribute to the die 202 and/or other electrical components.

Figure 4A:
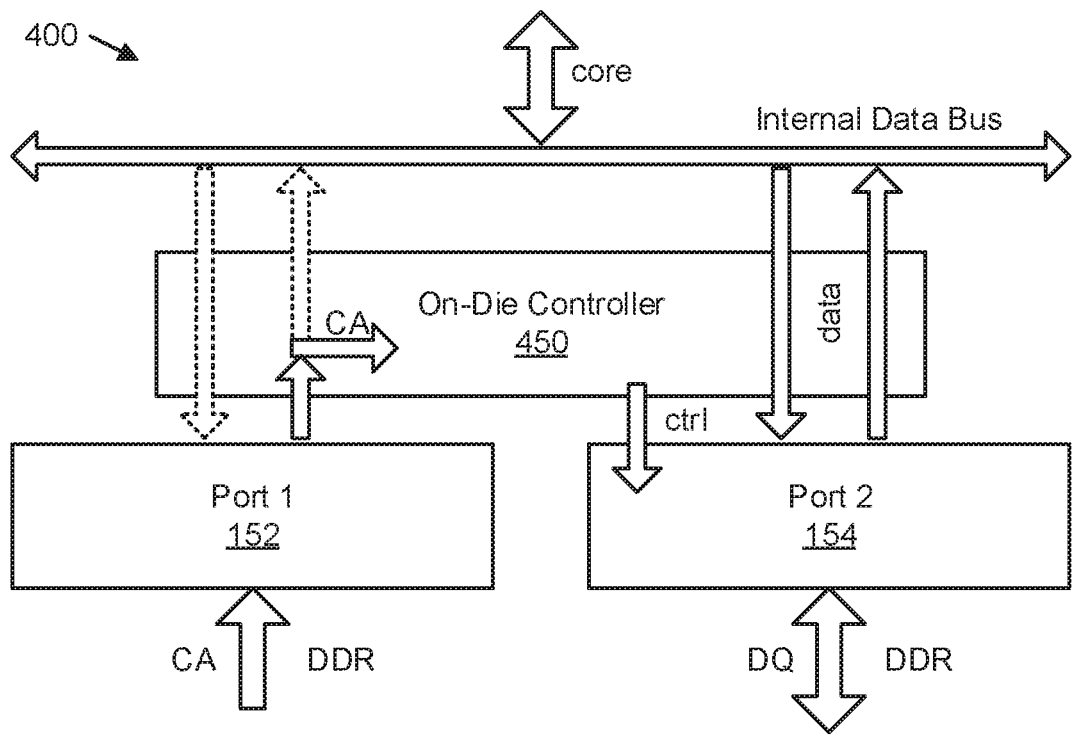
FIG. 4A is a schematic block diagram illustrating one embodiment of peripheral components for a memory die.
Figure 4B:
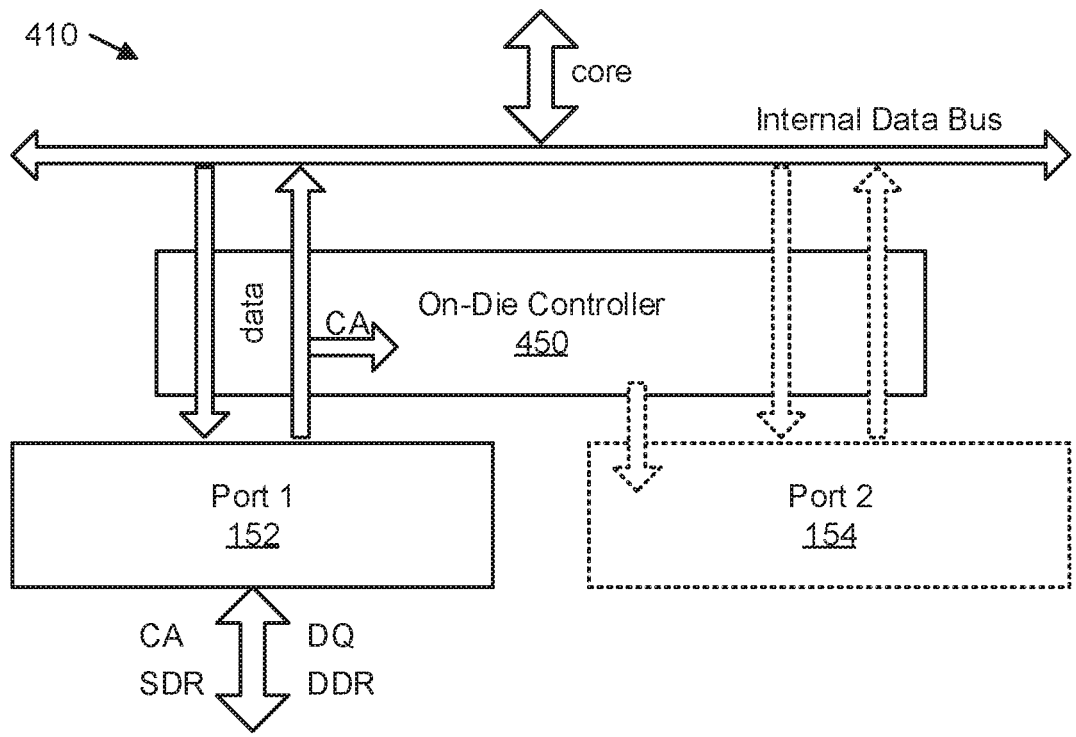
FIG. 4B is a schematic block diagram illustrating another embodiment of peripheral components for a memory die.
Figure 4C:
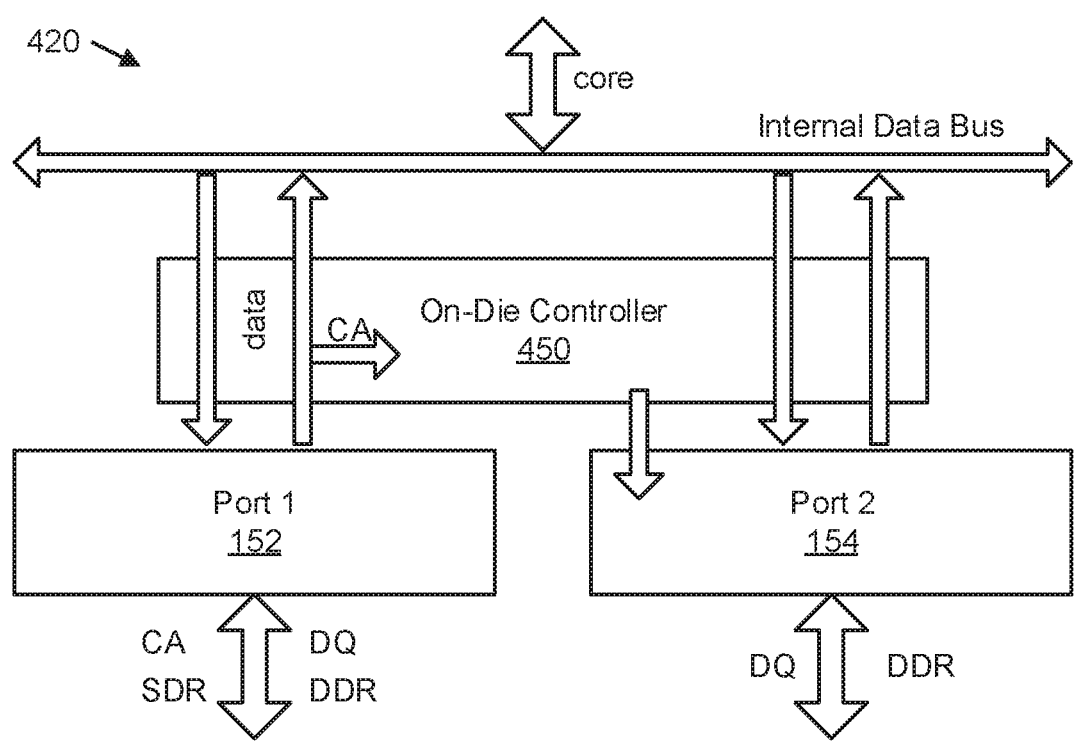
FIG. 4C is a schematic block diagram illustrating another embodiment of peripheral components for a memory die.

FIGS. 4A, 4B and 4C depict embodiments of peripheral components 400, 410, 420 for a memory die 202. As described above with regard to FIG. 2, in certain embodiments, a die 202 may be a semiconductor device of non-volatile memory. In the depicted embodiments, a die 202 includes an array of non-volatile memory cells referred to as a core, and peripheral components 400, 410, 420 that communicate with the core to perform data operations such as reading, writing, erasing, and the like. In certain embodiments, a "cell" may refer to a smallest or fundamental physical unit of memory, or storage, for a die 202, and may be referred to interchangeably as a "storage cell" a "memory cell" or the like. For example, a cell may be a floating gate transistor for NAND flash memory, a memristor for resistive memory, or the like. Thus, in a further embodiment, an array of cells may be a two-dimensional grid, a three-dimensional block, a group, or other similar set of cells where data can be physically stored, for short-term memory use, long-term storage use, or the like. In certain embodiments, peripheral components 400, 410, 420 include components of a die 202 other than the core array of cells. In the depicted embodiments, the peripheral components 400, 410, 420 include a set of ports, including a first port 152 and a second port 154, and an on-die controller 450.

A die 202, in various embodiments, may refer to an integrated circuit that includes both a core array of non-volatile memory cells and peripheral components 400, 410, 420 for communicating with the core. In one embodiment, such an integrated circuit may be a three-dimensional integrated circuit that includes multiple die planes and/or layers, but may still be referred to as a die 202. In certain embodiments, a die 202 may include more than one core arrays of non-volatile memory cells. For example, a multi-core die 202 may write data to one core while reading from another core. However, in other embodiments, a die 202 may include a single core array of non-volatile memory cells. As described with regard to FIGS. 1-3, a non-volatile memory device 120 or non-volatile memory element 123 may include one or more dies 202.

The set of ports, in the depicted embodiment, includes a first port 152 and a second port 154, which may be substantially as described above with regard to FIG. 1. Each port 152, 154 includes a plurality of electrical contacts, so that the first port 152 includes a first plurality of electrical contacts and the second port 154 includes a second plurality of electrical contacts. The specific electrical contacts for each port 152, 154 are described in further detail below with regard to FIGS. 5A, 5B, and 5C.

In various embodiments, an electrical contact for a die 202 may refer to a pad, lead, wire, or the like that is configured to communicate an electrical signal or value between the die 202 and an external component such as a device controller 126. In further embodiments, a port may refer to a set, grouping, or collection of one or more electrical contacts. In certain embodiments, a port may refer to a group of electrical contacts that are physically separated from other contacts. For example, in one embodiment, the electrical contacts for the first port 152 may be physically separated from the electrical contacts for the second port 154. As a further embodiment, a first port 152 may include a first row or array of input/output (I/O) pads for a die 202, and the second port 154 may include a second row or array of I/O pads for a die 202, separated by a region that does not include I/O pads. In another embodiment, a port may refer to a logical grouping of electrical contacts, regardless of whether the contacts are physically separated from contacts of other ports. For example, contacts for a second port 154 may be interleaved between contacts for a first port 152. Various ways of arranging electrical contacts and of grouping electrical contacts into ports 152, 154 will be clear in view of this disclosure.

The on-die controller 450, in one embodiment, communicates via the set of ports to receive command and address information and to transfer data for data operations on the core array of memory cells. In various embodiments, an on-die controller 450 may refer to a component, control/operation logic, a set of components, or the like on a die 202, that receives command and/or address information, transfers data via a set of ports, communicates data between a set of ports and a core array of memory cells, and/or performs data operations using communicated data. Communicating via the set of ports may include any form of sending or receiving information via the electrical contacts of the first port 152 and/or the second port 154.

In various embodiments, the on-die controller 450 may use the first port 152 in various modes to receive command and address information and/or to transfer data for data operations. In further embodiments, the on-die controller 450 may use the second port 154 as a data-only port, to transfer data but not to receive command and address information. For example, in a burst mode, the on-die controller 450 may use the first port 152 to receive command and address information, and use the second port 154 to transfer data. In a legacy page mode, the on-die controller 450 may use the first port 152 to receive command and address information, and to transfer data, and the second port 154 may be unused. In a non-legacy page mode, the on-die controller 450 may use the first port 152 to receive command and address information, and to transfer data, and may also use the second port 154 to transfer data. In certain embodiments, transferring data via the first port 152 and the second port 154 may increase data transfer rates, thereby reducing the total time to perform a data operation, in comparison to using only one of the ports 152, 154 to transfer data.

Command and address information may include commands, such as read commands, write commands, program commands, erase commands, status query commands, and any other commands supported by a die 202, and addresses corresponding to the commands, such as an address to write data to, and address to read data from, or the like. The on-die controller 450 may receive command and address information from a device controller 126. For example, the device controller 126 may send command and address information using the command and address lines 308, including the command and address bus CA, command and address strobe true line CASt, and command and address strobe complement line CASc.

Data operations may include read, write, program, or erase operations, or the like, and data for the data operations may include data to be written to the core array of memory cells, data to be read from the core array of memory cells, or the like. Thus, in certain embodiments, transferring data for a data operation may include transferring write data to the core array of memory cells, transferring read data from the core array of memory cells, or the like. Transferring data may include sending data, receiving data, making data available to a device controller 126 on latches, or the like. In one embodiment, the on-die controller 450 may transfer data for data operations between the core array of memory cells and a device controller 126. For example, for a write operation, the on-die controller 450 may receive the data to be written from the device controller 126. Similarly, for a read operation, the on-die controller 450 may send the read data to the device controller 126. In certain embodiments, the data lines 302, including the bidirectional data bus DQ, data strobe true line DQSt, and data strobe complement line DQSc may be used by the on-die controller 450 and/or the device controller 126 to transfer data for a data operation.

FIG. 4A depicts one embodiment of the peripheral components 400, in a burst mode. In the burst mode, the on-die controller 450 uses both the first port 152 and the second port 154. In certain embodiments, the burst mode provides a storage class memory interface, in which the on-die controller 450 receives the command and address information for a data operation via the first port 152, and transfers the data for the data operation via the second port 154.

In general, in various embodiments, a storage class memory may refer to a non-volatile memory that combines the capability for long-term, non-volatile data storage (typical of traditional storage devices) with fast, byte-level access (typical of traditional DRAM volatile memory). Latency of storage class memory may still be greater than for DRAM in certain embodiments, but may be substantially less than latency for traditional NAND flash storage devices. For example, in one embodiment, latency for a NAND flash storage device may be measured in tens of microseconds, while latency for DRAM may be measured in tens of nanoseconds, and latency for storage class memory may be measured in hundreds of nanoseconds. In general, in various embodiments, storage class memory may be significantly more storage dense than DRAM, but significantly faster than traditional storage devices. In certain embodiments, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof In further embodiments, a storage class memory interface may refer to any interface for storage class memory that provides access to storage class memory features not typical of legacy or traditional non-volatile memory devices. For example, a storage class memory interface may provide full-speed access to storage class memory at a byte-level level granularity, in four-byte bursts, eight-byte bursts, or the like. (By contrast, a traditional block I/O interface for non-volatile storage may provide lower-speed access at a page or block-level granularity.)

In the depicted embodiment, the burst mode, provided by the peripheral components 400 (e.g., a ReRAM burst mode) may provide random access (e.g., byte addressable) read and/or write operations of fixed burst lengths. For example, in a burst mode, a non-volatile memory die 202 may receive an address (e.g., at a byte granularity) in association with a read and/or write command, and may execute the command for the received address and a predefined number of additional addresses (e.g., of the fixed burst length), in sequence after the received address, reading and/or writing data of the command for the entire sequence (e.g., an 8 byte, 16 byte, 24 byte, 32 byte, 48 byte, 64 byte, and/or 128 byte fixed burst length, or the like).

In certain embodiments, a burst length may be less than 1 kilobyte (or kibibyte), so that the on-die controller 450 transfers less than a kilobyte (or kibibyte) of data for a data operation in the burst mode. In various embodiments, a latency time between receiving command and address information for a burst mode operation and transferring the data may be significant in comparison to the data transfer time for a small amount of data (e.g., a burst of less than a kilobyte). Accordingly, in certain embodiments, an on-die controller 450 may provide separate paths or ports for command/address information and for data in a burst mode, so that the on-die controller 450 can receive and queue command and address information for one operation while transferring data for another data operation. In certain embodiments, queueing command and address information for one operation while transferring data for another data operation in a burst mode may provide high overall data transfer rates by reducing the overall effect of latency.

Accordingly, in the burst mode, both a first port 152 and a second port 154 may be used by the on-die controller 450. In the burst mode, in the depicted embodiment, electrical contacts of the first port 152 receive command and address information for a data operation on a non-volatile memory element 123. Electrical contacts of the second port 154, in the depicted embodiment of the burst mode, transmit data of the data operation (e.g., receive data for a write/program operation, send data for a read operation, or the like). In certain embodiments, while in the burst mode, the first port 152 is used for command and address information only (e.g., a command and address bus CA 308, one or more command and address strobe signals CAS 308, or the like) and the second port 154 is used for data only (e.g., a data bus DQ 302, one or more data strobe signals DQS 302, one or more read enable signals RE 304, or the like), allowing two separate sets of I/Os, one on each port 152, 154.

In the depicted embodiment, in the burst mode the command and address bus CA and the data bus DQ are both double data rate buses. Command and address information is received via the command and address bus CA at the first port 152. The command and address information goes to the on-die controller 450, which controls the second port 154 and the transfer of data between the core and the second port 154 (via the internal data bus). The on-die controller 450 receives data for a write command, or sends data for a read command, via the second port 154.

In various embodiments, using a first port 152 to receive command and address information and a second port 154 to transfer data may allow the on-die controller 450 to receive command and address information and transfer data simultaneously. For example, command and address information for a later command may be received while data is transferred for an earlier command. In certain embodiments, as commands and addresses are received using the first port 152, a command queue for the on-die controller 450 stores the commands and addresses while the die 202 sequentially executes the commands (e.g., in the order received on the first port 152) and the data for each operation is transmitted successively using the second port 154 (e.g., in the order the commands were received on the first port 152), allowing the device controller 126 to queue several commands at once for back to back execution, overlapping execution, parallel execution, or the like.

FIG. 4B depicts one embodiment of the peripheral components 410, in a legacy page mode. In a legacy or non-legacy page mode, the on-die controller 450 may transfer a multiple kilobyte page of data (e.g., a 2 KiB page, 4 KiB page, 8 KiB page, 16 KiB page, or the like) for a data operation. In one embodiment, data may be byte-addressable in a burst mode, and page addressable in a page mode. In various embodiments, providing sequential access to a multiple-kilobyte page of data in page mode may be more efficient than providing byte-addressable access to the same data in bursts of less than a kilobyte in burst mode, due to the reduced number of commands corresponding to reduced latency for processing commands. However, burst mode may be more efficient for providing random access to smaller amounts of data than a page. For example, if a client 116 requests less than a page of data, it may be more efficient not to transfer a whole page. In certain embodiments, a legacy page mode may provide backward compatibility with an interface of a legacy type of memory die. A non-legacy page mode, in further embodiments, may provide page-level data transfers that may or may not be fully backward compatible with legacy memory media.

In the legacy page mode, the on-die controller 450 uses the first port 152 without the second port 154. In certain embodiments, the legacy page mode provides compatibility with an interface of a legacy type of memory die. In general, in various embodiments, a legacy type of memory die may refer to an older type of memory die than the die 202. For example, the die 202 may include storage class memory, and a legacy type of memory die may include a different type of non-volatile memory medium and/or non-volatile storage medium, such as (for example) NAND flash. In another embodiment, a legacy type of memory die may use an older protocol than the storage class interface for the die 202, such as an Open NAND Flash Interface (ONFI) protocol, a toggle mode or double data rate (DDR) protocol, a Common Flash Memory Interface (CFI), or the like. The on-die controller 450, in the legacy page mode, may provide compatibility with legacy memory die, by emulating the legacy memory medium, emulating the legacy protocol, or the like. In certain embodiments, using two or more modes and providing backward compatibility with legacy memory die in the legacy page mode may allow clients to access the full feature set of storage class memory in the burst mode, and may allow older clients to use storage class memory as if it were an older type of memory or storage in the legacy page mode.

In certain embodiments, the legacy page mode provides a NAND storage interface, in which the on-die controller 450 both receives the command and address information and transfers the data via the first port 152. In various embodiments, a NAND storage interface may refer to any interface for accessing NAND flash storage, such as an Open NAND Flash Interface (ONFI) interface, a toggle mode NAND interface, a Common Flash Memory Interface (CFI), or the like. In certain embodiments, a NAND storage interface may provide page or block-level, rather than byte-level access to storage or memory cells. In some embodiments, a NAND storage interface may emulate aspects of NAND flash storage, such as page-level programming and block-level erasing, even when the underlying memory for the core array of memory cells is storage class memory.

In the legacy page mode (e.g., a compatibility mode, a NAND toggle mode, or the like), the second port 154 is not used, and only the first port 152 is used. In the depicted embodiment, the first port 152 is used for both receiving command and address information for a data operation and transmitting data of the data operation (e.g., receiving data for a write/program operation, sending data of a read operation, or the like). In the depicted embodiment, in the legacy page mode, the data bus DQ is a double data rate bus, as in the burst mode, but the command and address bus CA is a single data rate bus. Command and address information is received via the command and address bus CA at the first port 152. The command and address information goes to the on-die controller 450, which controls data transfer between the core and the first port 152 (via the internal data bus). The second port 154 is inactive in the legacy page mode. Using the first port 152 for command and address information and data may prevent command and address information from being transferred at the same time as data for data operations, but may provide backwards compatibility with legacy NAND devices or other types of legacy storage.

Thus, in various embodiments, both the first port 152 and the second port 154 are used for data operations in a burst mode, but the first port 152 is used without the second port 154 for data operations in the legacy page mode. The peripheral components 400, 410, 420 in certain embodiments, may dynamically transition from a burst mode to a legacy page mode, and/or a non-legacy page mode based on a command received, a protocol used, or the like, even for successively received commands, which may be adjacent in a command queue or the like.

FIG. 4C depicts one embodiment of the peripheral components 420, in a non-legacy page mode. As described above with regard to the legacy page mode of FIG. 4B, in a page mode (including a non-legacy page mode) the on-die controller 450 may transfer a multiple kilobyte page of data for a data operation.

In the non-legacy page mode, the on-die controller 450 uses the first port 152 to receive command and address information and to transfer data for data operations, and uses the second port 154 to transfer data (e.g., to or from a device controller 126) but not to receive command and address information. Thus, in various embodiments and/or modes, the first port 152 may be used for command/address information only (e.g., in burst mode), or for command/address information and data (e.g., in legacy or non-legacy page modes), and the second port 154 may be a data-only port that is not used for command/address information.

Command and address information is received via the command and address bus CA at the first port 152. In a certain embodiment, an interface for command and address interface may be compatible with a legacy type of memory die. For example, the command interface may be compatible with an ONFI interface, a NAND toggle mode interface, a CFI interface, or the like, even in the non-legacy page mode. In another embodiment, however, the command interface may be incompatible with legacy interfaces. In the depicted embodiment, the command and address bus CA is a single data rate bus, as in the legacy page mode. In another embodiment, the command and address bus CA may be a double data rate bus for the non-legacy page mode.

The command and address information goes to the on-die controller 450, which controls data transfer between the core and the first and second ports 152, 154 (via the internal data bus). The on-die controller 450 uses the first port 152 and the second port 154 to transfer data for data operations. In the depicted embodiment, both ports 152, 154 provide a double data rate data bus DQ for transferring data. In various embodiments, an on-die controller 450 using both ports 152, 154 to transfer data in a non-legacy page mode may transfer data approximately twice as fast as an on-die controller 450 using only the second port 154 to transfer data in a legacy page mode.

In certain embodiments, an on-die controller 450 may transfer one or more pages of data in two steps, where a first step transfers data to page register latches of a memory die 202, and a second step completes the data transfer by transferring data from the latches. For example, an on-die controller 450 may perform a read operation by transferring data from the core array or memory cells to on-die latches, then transferring data from the latches to the device controller 126. Similarly, an on-die controller 450 may perform a write operation by transferring data to on-die latches from the device controller 126, then transferring data from the latches to the core. Data transfer times for transferring data to or from the core may improve with improving memory technology. For example, a sensing time for transferring read data from the core to the page register latches may be faster for storage class memory (e.g., ReRAM) than for legacy memory (e.g., NAND flash).

As sensing time improves, access time for transferring read data from the page register latches to the device controller 126 may become a proportionally more important bottleneck for a data transfer. For example, in certain embodiments an 8 microsecond access time may be proportionally unimportant compared to an 85-110 microsecond sensing time for NAND flash memory. However, the same 8 microsecond access time may be double a 4 microsecond sensing time for ReRAM memory. In a further embodiment, using both ports 152, 154 to transfer data for a data operation may reduce the data access time by approximately 50% by providing twice as many electrical contacts for transferring data, and may significantly reduce the total data transfer time. For example, with a 4 microsecond sensing time, reducing the access time from 8 microseconds to 4 microseconds may provide a 33% improvement in total read time. Similarly, using both ports 152, 154 to transfer data for a write operation may improve total write time by improving the transfer time from the device controller 126 to the page register latches.

In a certain embodiment, the on-die controller 450 may perform a data operation (e.g., a read, write, program, or erase operation) by receiving command and address information for the data operation via the first port 152, and transferring data for the data operation via the first port 152 and the second port 154. In a further operation, the on-die controller 450 may transfer data of a data operation to or from the device controller 126 using the first port 152 and the second port 154 simultaneously. Transferring data via both ports 152, 154 simultaneously may prevent the on-die controller 450 from receiving additional commands during the data transfer (as in the legacy page mode), but may significantly improve overall data transfer speeds.

In certain embodiments, transferring data via both ports 152, 154 may effectively double the width of the data transfer bus. For example, if the first port 152 and the second port 154 provide 8 I/O lines, using both ports 152, 154 to transfer data simultaneously may allow the on-die controller 450 to transfer data in sixteen-bit units. Thus, a device controller 126 for a legacy type of memory die, configured for 8-bit data transfers via a single port, may not support data transfer for a non-legacy page mode. Rather, in certain embodiments, a device controller 126 compatible with a non-legacy page mode provided by an on-die controller 450 may support wider data transfers (e.g., in sixteen-bit units) from both ports 152, 154. However, in one embodiment, the command and address information transmitted via the first port 152 may still conform to a legacy interface (e.g., an interface for an 8-bit port).

In various embodiments, the first port 152 and the second port 154 may provide identical or different numbers of electrical contacts for input/output. Thus, transferring data via both ports 152, 154 may change the effective width of the data bus by a factor of two, or by a factor other than two, depending on the relative width of the ports 152, 154. However, transferring data using the same electrical contracts that were used for command/address information (e.g., the first port 152), and using additional electrical contacts (e.g., the second port 154) may still improve data transfer speeds by some amount.

In certain embodiments, the on-die controller 450 may enable or disable one or more ports 152, 154 in response to a mode (e.g., a burst mode, a legacy page mode, or a non-legacy page mode) being set. In various embodiments, a mode may be set by a command from a device controller 126, by modifying hardware (e.g., bridging or disconnecting two pins), or the like. In one embodiment, a mode may be permanently or semi-permanently set by a manufacturer of a memory die 202, a non-volatile memory device 120 or the like. In another embodiment, a mode may be set or changed by a user or administrator. For example, a command queue may include a combination of burst mode commands, legacy page mode commands and/or non-legacy page mode commands, and an on-die controller 450 may switch modes in response to a type of command, a separate mode-switch command, or the like.

In various embodiments, enabling or disabling a port may include coupling or de-coupling on-die components to the port (e.g., via switch transistors or the like), executing logic to perform functions using the port (e.g., to send or receive data transferred via the port), or the like. Enabling a port may refer to configuring the port to send or receive information. Similarly, disabling a port may refer to configuring the port to neither send nor receive information. For example, in various embodiments, a port may be enabled for sending data by coupling and/or connecting the port to a component that sends data, enabled for receiving data by coupling and/or connecting the port to a component that receives data, or disabled by decoupling and/or disconnecting the port, or simply by ignoring signals on the port.

In a non-legacy page mode, the on-die controller 450 may transfer a multiple-kilobyte page of data for a data operation using the first port 152 and the second port 154. Thus, in a certain embodiment, the on-die controller 450 may enable the first port 152 and the second port 154 for data transfer in response to the non-legacy page mode being set. For example, the on-die controller 450 may couple both ports 152, 154 to page register latches for sending or receiving data in response to the non-legacy page mode being set.

Conversely, in a burst mode, the on-die controller 450 may transfer less than a kilobyte of data for a data operation using the second port 154 without the first port 152. (The first port 152, however, would still be used to receive command and address information for the data operation). Thus, in a further embodiment, the on-die controller 450 may disable the first port 152 for data transfer and enable the second port 154 for data transfer in response to the burst mode being set. For example, the on-die controller 450 may couple the second port 154 to page register latches for sending or receiving data, de-couple the first port 152 from the page register latches, and couple the first port 152 to a command queue for receiving command and address information.

Figure 5A:
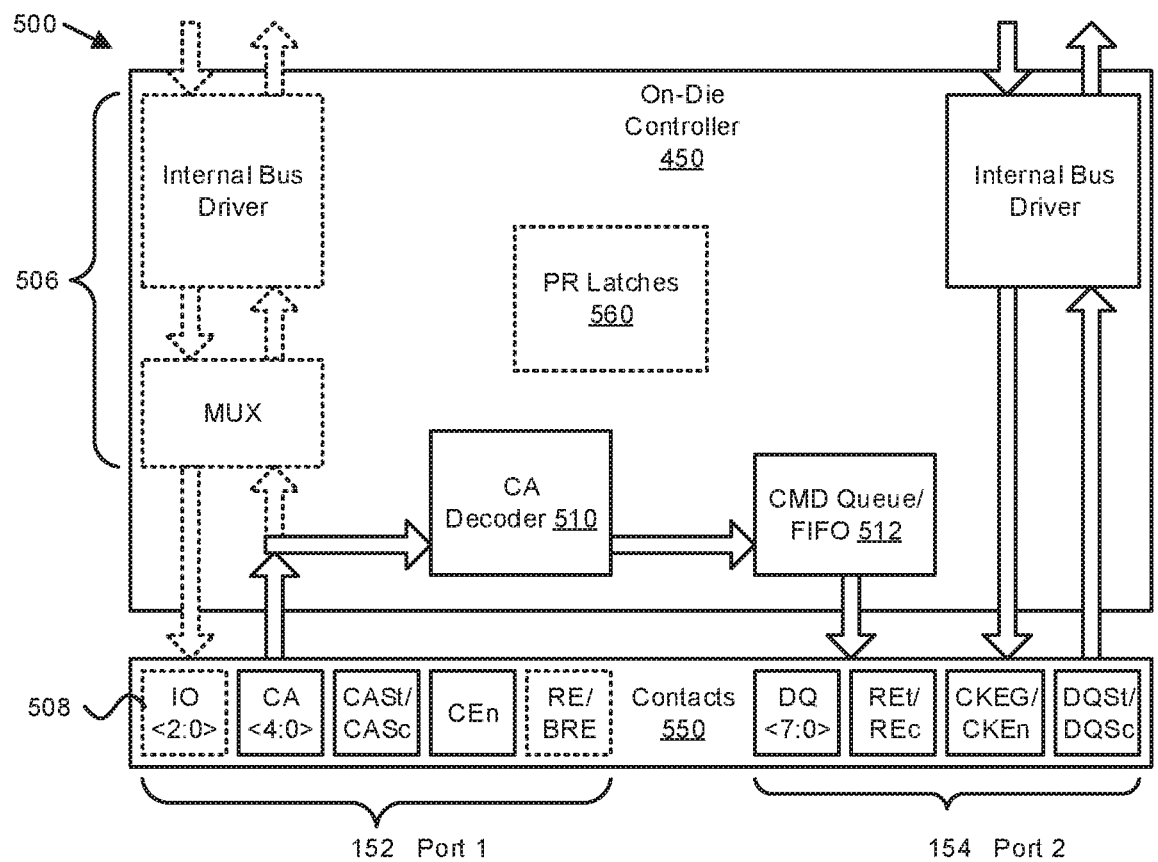
FIG. 5A is a schematic block diagram illustrating one embodiment of peripheral components for a memory die.
Figure 5B:
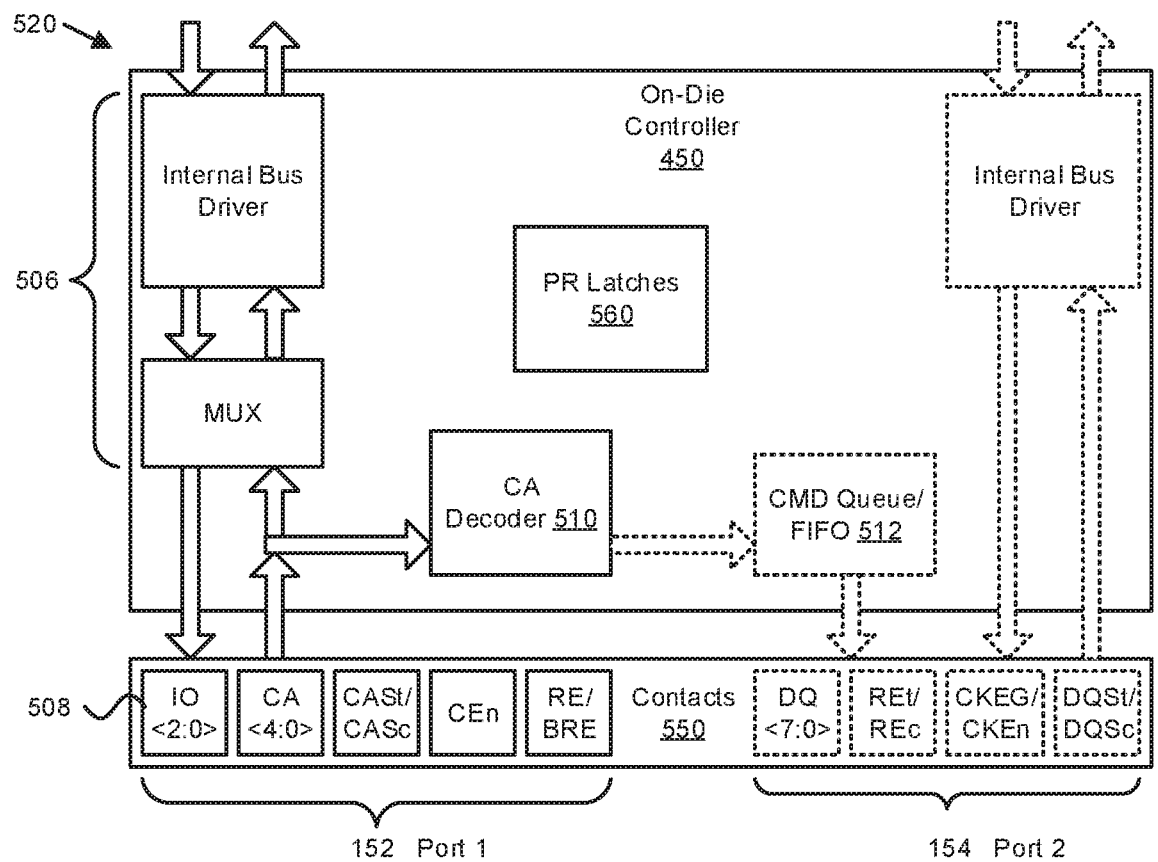
FIG. 5B is a schematic block diagram illustrating another embodiment of peripheral components for a memory die.
Figure 5C:
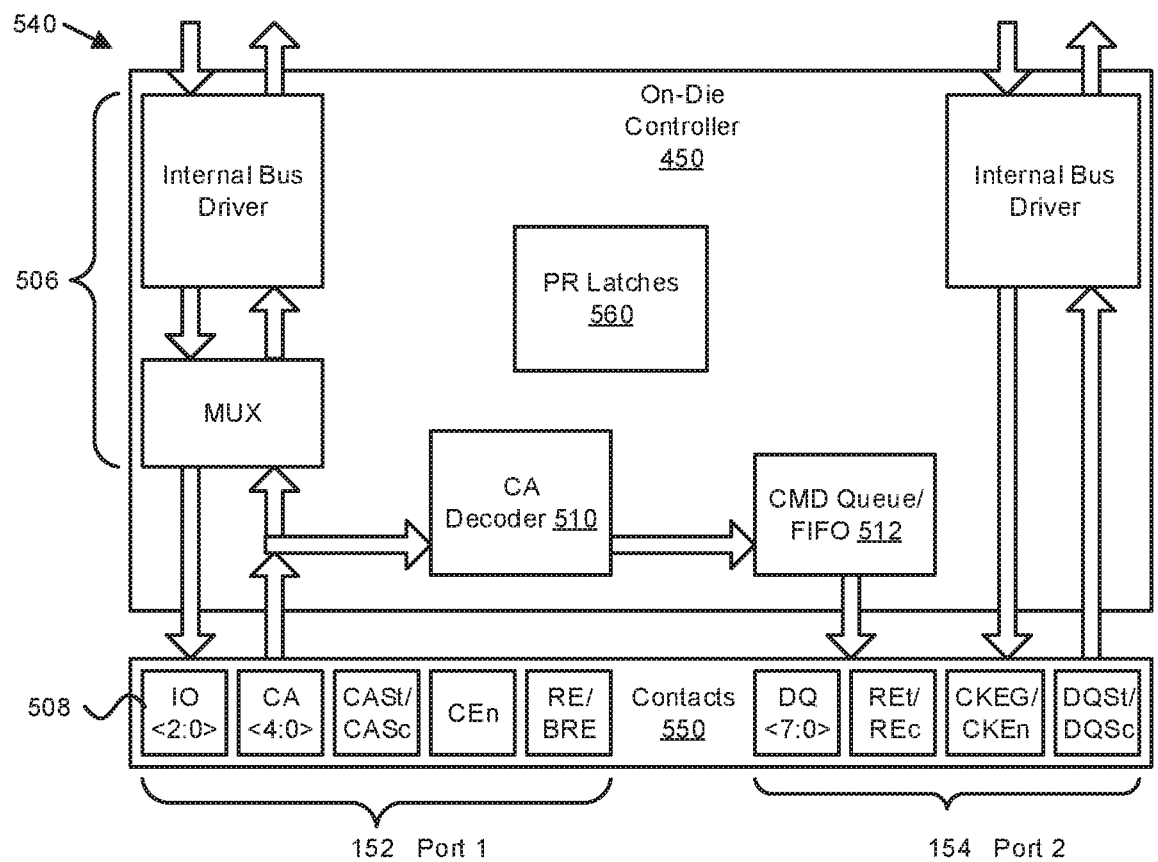
FIG. 5C is a schematic block diagram illustrating another embodiment of peripheral components for a memory die.

FIGS. 5A, 5B, and 5C depict embodiments of peripheral components 500, 520, 540 for a memory die 202, including an on-die controller 450, and contacts 550, grouped into a first port 152 and a second port 154, as described above. In the depicted embodiment, the contacts 550 for the first port 152 include five contacts 550 for the five-bit control and address bus CA, latches for incoming command and address information (or for data in a legacy or compatibility mode), and contacts 550 for true and complementary command and address strobe signals CASt and CASc. Three additional contacts 550 are provided for I/O lines 508, to provide eight bit wide data transfer via the first port 152 (e.g., in a legacy or non-legacy page mode). One contact 550 is provided for receiving a chip enable signal CEn. (The package described with regard to FIG. 3 includes an eight bit chip enable line for eight dies 202, and a single die 202 may be enabled or disabled for receiving command/address information by one bit).

In the depicted embodiment, the contacts 550 for the second port 154 include eight contacts 550 for the eight-bit bidirectional data bus DQ, latches for data, and contacts 550 for true and complementary data strobe signals DQSt and DQSc. The contacts 550 also include contacts 550 for true and complementary signals for a read enable clock RE. Lastly, contacts 550 are provided for receiving a clock enable signal CKEn and a rank group clock enable signal CKEG. (The package described with regard to FIG. 3 includes a four bit clock enable line, and a one bit rank group clock enable line CKEG for eight dies 202, so that a single die 202 may be activated or deactivated for data transfer with one clock enable bit and the rank group clock enable line). In the depicted embodiment, the on-die controller 450 includes muxing components 506, such as multiplexers (MUX) and internal data bus drivers, a command and address decoder 510, and a command queue 512.

FIG. 5A depicts one embodiment of peripheral components 500 for a non-volatile memory die 202 in a burst mode (e.g., a ReRAM burst mode, or the like). In the depicted embodiment, both a first port 152 and a second port 154 are used in the burst mode, the first port 152 for command and address information for commands and the second port 154 for transmitting data of the commands. As indicated by dotted outlines, certain muxing components 506 and I/O lines 508 of the first port 152 are not used in the burst mode. For example, the I/O lines 508 may be used to provide eight-bit data transmissions via the first port 152 in a legacy or non-legacy page mode, but may be unused, disabled, or deactivated in the burst mode. Additionally, the muxing components 506 may provide one or more legacy functions, may assist in switching between modes, or the like. Using separate data paths in the burst mode, in certain embodiments, may lower read latency, remove extra muxing logic 506, or the like (e.g., since sharing a single data path for command and address information and data of a command may require more muxing of data, clock, signals, or the like).

A set of page register latches 560 for a memory die 202 may be disabled in the burst mode. In certain embodiments, page mode operations may include temporarily storing one or more pages of data in a set of latches 560 prior to completing the operations. For example, reading a page of data may include transferring read data from the core array of non-volatile memory cells to the page register latches 560 in response to a first command, and transferring the data from the latches 560 to the device controller 126 in response to a second command. Similarly, writing a page of data may include transferring the write data from the device controller 126 to latches 560, prior to writing the data to the core array. In various embodiments, transferring data between the memory die 202 and the device controller 126 may allow one or two bytes (or another small number of bytes, depending on the number of contacts 550 used for data transfer) to be transferred at a time. Thus, transferring data for a multiple-kilobyte page may take thousands of clock cycles (e.g., cycles of an RE strobe, a DQS strobe, or the like). By contrast, an internal bus for transferring data from latches 560 to the core may have a much larger bus width than the ports 152, 154, and buffering data in the latches 560 may allow the internal bus to be more fully utilized.

In certain embodiments, however, a burst of data smaller than a page may be efficiently written to the core or read from the core without first buffering the data burst in the page register latches 560. Thus, in the depicted embodiment, the page register latches 560 are disabled in burst mode. In another embodiment, however, the page register latches 560 may be enabled and used in burst mode. For example, the page register latches 560 may store queued data for multiple burst mode data transfers.

FIG. 5B depicts another embodiment of peripheral components 520 for a non-volatile memory die 202 in a legacy page mode (e.g., a compatibility mode, a NAND toggle mode, or the like). In the depicted embodiment, only a first port 152 is used in the legacy page mode, for both command and address information for commands and for transmitting data of the commands. The muxing components 506 and I/O lines 508 of the first port 152, in the depicted embodiment, are used in the legacy page mode. The page register latches 560, in the depicted embodiment, are used in the legacy page mode as described above, for temporarily storing data of a data operation prior to a second command for completing the data operation. The second port 154, however, is not used in the legacy page mode, as indicated by dotted outlines.

A command queue 512 (e.g., a first-in-first-out (FIFO) queue of commands), in certain embodiments, may be used to determine which mode is associated with a next command, and which ports to enable for data transfer. For example, multiple commands (e.g., in a burst mode, a legacy page mode, a non-legacy page mode, or a mixture of modes) may be issued on the first port 152, and stored in the command queue 512, before data is transmitted (e.g., toggled) on the second port 154. In certain embodiments, the command queue 512 may comprise a separate read queue and write queue, with pointers that move through the commands in the queues (e.g., moving to a next command at the end of a burst or series of clock pulses, at the end of a command, at the end of a predetermined number of cycles, or the like).

In the depicted embodiments of FIGS. 5A, 5B, and 5C the on-die controller 450 may use at least a set of contacts 550 of the set of ports 152, 154 for single ended input/output, and may use at least one pair of contacts 550 of the set of ports 152, 154, for a differential strobe. Single-ended input/output, in various embodiments, may refer to inputs or outputs that share a common voltage reference (e.g., ground and/or another reference voltage). For example, the five-bit command and address bus CA and/or the eight bit data bus DQ may be single ended buses, so that a set of five contacts 550 for a five bit bus or a set of eight contacts 550 for an eight-bit bus carries five or eight voltages, respectively, and uses a common voltage reference. In certain embodiments, a voltage reference for command and address bus CA may be different from a voltage reference for data bus DQ.

In certain embodiments, a differential strobe may refer to a clock, strobe, or other timing signal that is carried using a pair of contacts 550 for true and complementary signals. For example, in some embodiments, one contact 550 may carry the true command and address strobe CASt, and a second contact 550 may carry a complementary (e.g., opposite) signal CASc. (The data strobe DQS, and/or read enable clock RE may similarly be differential strobes with true and complementary signals DQSt/DQSc and REt/REc, respectively). In certain embodiments, a difference between the true and complementary signals may provide a strobe that oscillates with a larger amplitude than either signal individually. Additionally, noise in one signal may be distinguished from a legitimate rising or falling edge based on whether it is reflected in the other signal. Thus, using a pair of contacts 550 for a differential strobe may improve the robustness of the signaling on the physical channel.

In general, in various embodiments, the strobe signals marshal the transmission of command and address information and data. In one embodiment, the on-die controller 450 receives the command and address information over the command and address bus CA, according to a command and address strobe signal CAS. The command and address strobe signal may be received via one or more command and address strobe lines of the set of ports (e.g., a single contact 550 for a single-ended CAS strobe, a pair of contacts 550 for a differential CASt/c strobe, or the like). The command and address strobe signal may be sent by a device controller 126, to control latching of commands and/or addresses. For example, in the burst mode, a command may be sent in a burst of four CAS clock cycles (or eight transfers, using double data rate signaling).

In a further embodiment, the on-die controller 450 transfers data for a data operation according to a data strobe signal DQS. The data strobe signal may be received via one or more data strobe lines of the set of ports (e.g., a single contact 550 for a single-ended DQS strobe, a pair of contacts for a differential DQSt/c strobe, or the like). For a write operation, the data strobe signal may be sent by a device controller 126, to marshal the data to be written, as it is sent from the device controller 126. For example, 64 bits of data to be written may be sent over an eight bit bidirectional data bus DQ in a burst or series of four DQS clock cycles (or eight transfers, using double data rate signaling). For a read operation, the data strobe signal DQS may be sent by the on-die controller 450 to the device controller 126, to marshal the transfer of data as it is sent to the device controller 126. In a certain embodiment, the data strobe signal DQS for a read may be sent by the on-die controller 450 based on a read enable clock signal RE sent by the device controller 126.

In a certain embodiment, the command and address strobe signal CAS may be independent from the data strobe signal DQS. Independent signals may be independently generated (e.g., by separate oscillators, or the like), instead of being based on each other or on a common global clock. In certain embodiments, distribution of a global (or other non-local) clock signal may consume a significant amount of power. By contrast, using independent CAS and DQS strobes may save power by avoiding the need to distribute a global clock. The read enable clock RE may similarly be independent from the command and address strobe signal CAS. (However, the data strobe signal DQS may be based on the RE clock for reads).

Additionally, in some embodiments, the CAS, DQS, and/or RE signals may be inactive when not in use. A clock or strobe signal may be referred to as inactive when it is at a fixed voltage, a floating voltage, or otherwise not toggling, cycling, or oscillating. For example, in a certain embodiment, the command and address strobe signal CAS may be inactive except when the on-die controller 450 receives command and address information, and the data strobe signal DQS may be inactive except when the on-die controller 450 transfers data. In certain embodiments, toggling a clock when the clock is not needed or in use may consume a significant amount of power. By contrast, deactivating CAS, DQS, and/or RE signals when not in use may save power. For example, DRAM volatile memory may use a free-running (e.g., continuous or uninterrupted) global clock to latch in command and address information and to transfer data. A latency period of tens of nanoseconds between starting the command and starting the data transfer may correspond to a small number of clock cycles, making a free-running clock reasonably practical for DRAM. By contrast, latency periods of hundreds of nanoseconds for storage class memory may correspond to a much larger number of clock cycles, so that significant power savings may be achieved by deactivating the clock(s) during the latency period.

FIG. 5C depicts another embodiment of peripheral components 540 for a non-volatile memory die 202 in a non-legacy page mode. In the depicted embodiment, the first port 152 is used for receiving command and address information for commands, and both the first port 152 and the second port 154 are used for transferring data of the commands.

In the depicted embodiment, components such as the command queue 512, multiplexing components 506, and the like are active in the non-legacy page mode. In another embodiment, however, the on-die controller 450 may disable components that are not used in the non-legacy page mode. For example, in one embodiment, the on-die controller 450 may not queue commands in the non-legacy page mode, and may disable the command queue 512.

In the depicted embodiment, the page register latches 560 are enabled in the non-legacy page mode. The command and address information for a data operation may include a first command and a second command, where the first command is for transferring data to the latches 560, and the second command is for transferring data from the latches 560. For example, for a read operation, the on-die controller 450 may read and transfer data from the core array to the latches 560 in response to a first command in the command and address information, and may transfer the read data from the latches 560 to the device controller 126 in response to a second command of the command and address information. (The command and address information for a single data operation may include two commands received at different times). Similarly, for a write operation the on-die controller 450 may store data from the device controller 126 in the latches 560 in response to a first command, and may write the data from the latches 560 to the core in response to a second command.

In various embodiments, using the first port 152 and the second port 154 to transfer data may provide faster transfer speeds in the non-legacy page mode of FIG. 5C than in the legacy page mode of FIG. 5B (which uses only the first port 152). In a certain embodiment, for a read operation, a data sensing time may refer to an elapsed time for transferring read data to the page register latches 560 in response to a first command (e.g., a time for sensing a physical state of the memory cells and converting the physical state to a data value stored by the latches 560). In a further embodiment, a data access time may refer to an elapsed time for transferring the read data from the latches 560 in response to a second command. For example, a data access time may be obtained by multiplying the amount of data to be transferred (e.g., a page) by the data transfer speed between the memory die 202 and the device controller 126. In certain embodiments, a data access time may be a bottleneck for reading data. For example, data sensing times may improve with improved memory technology, and data access time in legacy page mode (e.g., using only the first port 152 to transfer data) may be double the sensing time, or more. However, in certain embodiments, using both ports 152, 154 to transfer data in the non-legacy page mode may reduce the data access time to less than double the data sensing time. In further embodiments, the data access time may be approximately equal to the data sensing time, faster than the data sensing time, or the like when both ports 152, 154 are used to transfer data in the non-legacy page mode.

In the depicted embodiment, the first port 152 and the second port 154 both comprise eight-bit input/output ports. In various embodiments, an eight-bit input/output port may provide eight I/O lines. In further embodiments, an eight-bit input/output port may provide additional lines for enable signals, strobe signals, or the like. For example, in the depicted embodiment, the first port 152 provides five contacts 550 for command and address information, and three additional contacts 550 for I/O lines 508, allowing the on-die controller 450 to use the first port 152 to receive command and address information in five-bit units, but to transfer data in eight-bit units. In certain embodiments, the on-die controller 450 may receive command and address information using the first port 152 in a format that conforms to an eight-bit interface of a legacy type of memory die. An eight-bit interface may provide eight I/O lines, and may use eight or fewer of the I/O lines for commands. For example, an eight-bit interface for a legacy memory die may use five I/O lines for commands. Command and address information may confirm to an interface of a legacy type of memory die if the command and address information is in a format used by the legacy type of die. For example, commands for a non-legacy page mode may be in the same format used for the legacy page mode.

Additionally, in the depicted embodiment, the second port 154 provides eight contacts 550 for data transfer. Thus, both ports 152, 154 are capable of providing bidirectional data transfer in eight-bit units. Accordingly, in a further embodiment, the on-die controller 450 in the non-legacy page mode may transfer data using the first port 152 and the second port 154 simultaneously, in sixteen-bit units (e.g., sixteen bits per DQS strobe cycle for a single data rate transfer, sixteen bits per rising or falling DQS strobe edge for a double data rate transfer, or the like).

In one embodiment, the device controller 126 may send separate strobe signals via the first port 152 and the second port 154, to control a data transfer in the non-legacy page mode. In the burst mode, the device controller 126 may send RE strobe signals (for a read) or DQS strobe signals (for a write) to the second port 154 to control data transfer via the second port 154. Similarly, in the legacy page mode, the device controller 126 may send strobe signals to the first port 152 to control data transfer. Thus, in the non-legacy page mode, the device controller 126 may send RE strobe signals (for a read) or DQS strobe signals (for a write) to both ports 152, 154, to control simultaneous data transfer through both ports 152, 154. In a certain embodiment, the device controller 126 may send identical or synchronized strobe signals to both ports 152, 154.

In another embodiment, the device controller 126 may send a single strobe signal to the on-die controller 450 (e.g., via one of the ports 152, 154) to control a data transfer, and the on-die controller 450 may synchronize the first port 152 and the second port 154 to the single strobe signal. For example, for a write, the device controller 126 may send data to both ports 152, 154, marshaled by a DQS strobe sent to one of the ports 152, 154, and the on-die controller 450 may synchronize the other port 152, 154 to the strobe signal by replicating the strobe signal at the other port 152, 154, internally transmitting the strobe signal to the other port 152, 154, using the same strobe signal to control latches 560 that receive data from both ports 152, 154, or the like. Similarly, for a read, the device controller may send an RE strobe to one of the ports 152, 154, and the on-die controller 450 may send the read data marshalled by a DQS strobe based on the RE strobe, where the DQS strobe accompanies the data at one or both of the ports 152, 154.

Figure 6:
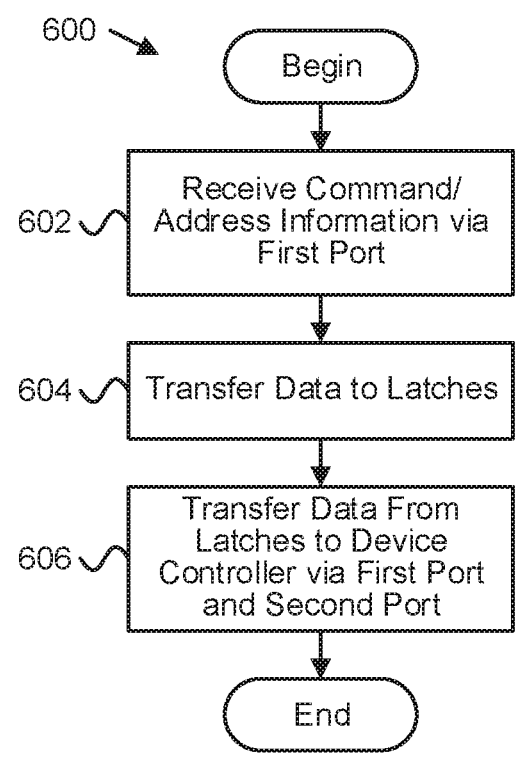
FIG. 6 is a schematic flow chart diagram illustrating one embodiment of a method for accessing a memory die.

FIG. 6 depicts one embodiment of a method 600 for accessing a memory die 202. The method 600 begins, and an on-die controller 450 receives 602 command and address information via a first port 152, for read operations of a memory die 202. The on-die controller 450 transfers 604 data of the read operations from a core array of the memory die to a set of latches 560 of the memory die. The on-die controller 450 transfers 606 the data of the read operations from the latches 560 to a device controller 126 via the first port 152 and a second port 154 of the memory die 202, and the method 600 ends. In a certain embodiment, the second port 154 is configured to transfer data but not to receive command and address information.

Figure 7:
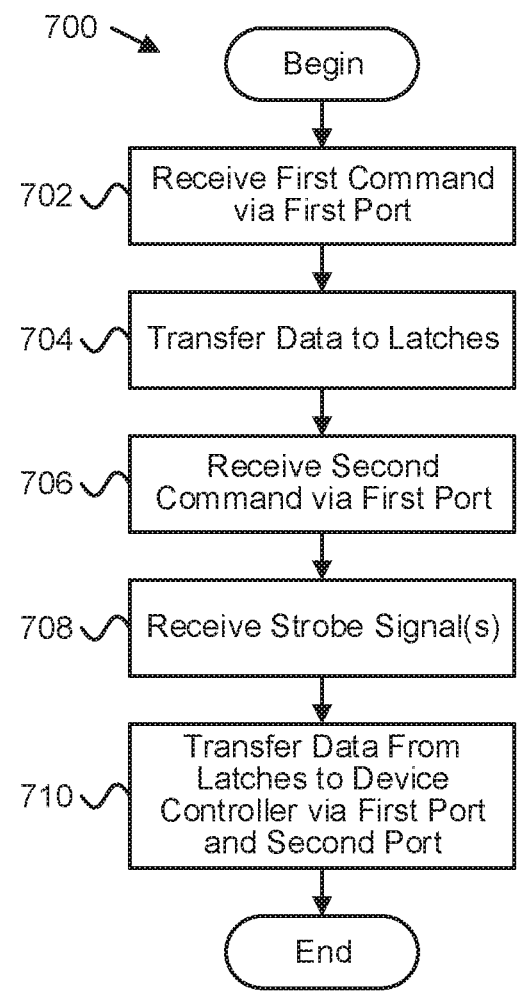
FIG. 7 is a schematic flow chart diagram illustrating another embodiment of a method for accessing a memory die.

FIG. 7 depicts one embodiment of a method 700 for accessing a memory die 202. The method 700 begins, and an on-die controller 450 receives 702 a first command via a first port 152, for a read operation of a memory die 202. In response to the first command, the on-die controller 450 transfers 704 data of the read operation from a core array of the memory die to a set of latches 560 of the memory die. The on-die controller 450 receives 706 a second command for the read operation, via the first port 152. The on-die controller 450 receives 708 one or more strobe signals from the device controller 126. In response to the second command, the on-die controller 450 transfers 710 the data of the read operation from the latches 560 to a device controller 126 via the first port 152 and a second port 154, according to the strobe signal(s), and the method 700 ends.

A means for receiving command and address information for data operations of a memory die, in various embodiments, may include a first port 152, an on-die controller 450, a set of latches, a command queue 512, other logic hardware, and/or other executable code stored on a computer readable storage medium. Other embodiments may include similar or equivalent means for receiving command and address information.

A means for transferring data of a data operation may, in various embodiments, may include a first port 152, a second port 154, an on-die controller 450, a set of page register latches 560, one or more internal bus drivers, one or more serializer/deserializers, one or more multiplexers, other logic hardware, and/or other executable code stored on a computer readable storage medium. Other embodiments may include similar or equivalent means for transferring data. In certain embodiments, a means for transferring data may include electrical contacts of a means for receiving command and address information (e.g., a first port 152), and additional electrical contacts (e.g., electrical contacts of a second port 154).

A means for sending one or more strobe signals to control data transfers, in various embodiments, may include a device controller 126, a bus 127, an oscillator or other clock/strobe signal generator, other logic hardware, and/or other executable code stored on a computer readable storage medium. Other embodiments may include similar or equivalent means for sending one or more strobe signals.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   one or more memory die, a memory die comprising:
      an array of non-volatile memory cells;
      a set of ports, the set of ports comprising a first port and a second port, the first port comprising a first plurality of electrical contacts and the second port comprising a second plurality of electrical contacts, wherein the first plurality of electrical contacts and the second plurality of electrical contacts are configured to communicate electrical signals between the memory die and a device controller external to the memory die; and
      an on-die controller that communicates via the first port and the second port to receive command and address information and to transfer data for data operations on the array of non-volatile memory cells, wherein the on-die controller uses the first port to receive command and address information and to transfer data, and uses the second port to transfer data but not to transfer command and address information.

2. The apparatus of claim 1, wherein the on-die controller receives command and address information for a data operation via the first port, and transfers data for the data operation via the first port and the second port.

3. The apparatus of claim 1, wherein the first port and the second port comprise eight-bit input/output ports.

4. The apparatus of claim 3, wherein the on-die controller receives command and address information using the first port in a format that conforms to an eight-bit interface of a legacy type of memory die, and transfers data in sixteen-bit units using the first port and the second port simultaneously.

5. The apparatus of claim 1, wherein:
   a memory die further comprises a set of latches;
   the on-die controller performs a read operation by transferring read data from the array of non-volatile memory cells to the set of latches in response to a first command, and by transferring the read data from the set of latches using the first port and the second port in response to a second command; and
   the on-die controller performs a write operation by transferring write data to the set of latches using the first port and the second port, and by transferring the write data from the set of latches to the array of non-volatile memory cells.

6. The apparatus of claim 5, wherein a data access time for transferring the read data from the set of latches in response to the second command is less than double a data sensing time for transferring the read data to the set of latches in response to the first command.

7. The apparatus of claim 1, further comprising the device controller, wherein the device controller sends strobe signals via the first port and the second port, to control a data transfer.

8. The apparatus of claim 1, further comprising the device controller, wherein the device controller sends a single strobe signal to the on-die controller to control a data transfer, and the on-die controller synchronizes the first port and the second port to the single strobe signal.

9. The apparatus of claim 1, wherein, in a page mode, the on-die controller transfers a multiple-kilobyte page of data for a data operation using the first port and the second port.

10. The apparatus of claim 9, wherein the on-die controller enables the first port and the second port for data transfer in response to the page mode being set.

11. The apparatus of claim 1, wherein, in a burst mode, the on-die controller transfers less than a kilobyte of data for a data operation using the second port without the first port.

12. The apparatus of claim 11, wherein the on-die controller disables the first port for data transfer and enables the second port for data transfer in response to the burst mode being set.

13. A method comprising:
   receiving command and address information at an on-die controller via a first port of a memory die, for read operations of the memory die;
   transferring data of the read operations from a core array of the memory die to a set of latches of the memory die; and
   transferring the data of the read operations from the latches to a device controller via the first port and a second port of the memory die, wherein the device controller is external to the memory die, the first port and the second port are configured to communicate electrical signals between an on-die controller of the memory die and the device controller, and the second port is configured to transfer data but not to transfer command and address information.

14. The method of claim 13, wherein transferring data of a read operation to the device controller is via the first port and the second port simultaneously.

15. The method of claim 14, wherein transferring the data of the read operation to the set of latches is in response to a first command of the command and address information.

16. The method of claim 15, wherein transferring the data of the read operation to the device controller is in response to a second command of the command and address information.

17. The method of claim 13, further comprising receiving strobe signals from the device controller via the first port and the second port, to control data transfer to the device controller.

18. The method of claim 13, further comprising receiving a single strobe signal from the device controller to control data transfer to the device controller, and synchronizing the first port and the second port to the single strobe signal.

* * * * *